United States Patent
Hong et al.

(10) Patent No.: US 8,455,275 B2
(45) Date of Patent: Jun. 4, 2013

(54) METHOD FOR MAKING LIGHT EMITTING DIODE PACKAGE

(75) Inventors: Meng-Hsien Hong, Hsinchu (TW); Wen-Liang Tseng, Hsinchu (TW); Hsin-Tung Chiang, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/309,576

(22) Filed: Dec. 2, 2011

(65) Prior Publication Data
US 2013/0001613 A1   Jan. 3, 2013

(30) Foreign Application Priority Data
Jun. 29, 2011   (CN) .......................... 2011 1 0179308

(51) Int. Cl.
*H01L 21/00*   (2006.01)
(52) U.S. Cl.
USPC .............................................. 438/26; 438/33
(58) Field of Classification Search
CPC .................... H01L 33/62; H01L 33/486; H01L 2924/01079
USPC ................................................. 438/22, 26, 33
See application file for complete search history.

(56) References Cited

U.S. PATENT DOCUMENTS

| | | | |
|---|---|---|---|
| 6,590,491 B2 * | 7/2003 | Hwang et al. ................ | 338/22 R |
| 2002/0163006 A1 * | 11/2002 | Yoganandan et al. ........... | 257/81 |
| 2003/0189830 A1 * | 10/2003 | Sugimoto et al. ............. | 362/294 |
| 2009/0278139 A1 * | 11/2009 | Fjelstad .......................... | 257/88 |

* cited by examiner

*Primary Examiner* — Nikolay Yushin
(74) *Attorney, Agent, or Firm* — Altis Law Group, Inc.

(57) ABSTRACT

A light emitting diode package includes a substrate with a first metal layer, a second metal layer and an insulating layer between the first metal layer and the second metal layer. A cavity is defined in the insulating layer and the second metal layer. The second metal layer surrounding the cavity is divided into a first conductive portion and a second conductive portion. An LED chip is positioned inside the cavity and on an upper surface of the first metal layer. The LED chip has two electrodes electrically connected to the first conductive portion and the second conductive portion respectively. The cavity is filled with an encapsulation to cover the LED chip. A method for manufacturing the LED package is also disclosed.

3 Claims, 10 Drawing Sheets

METHOD FOR MAKING LIGHT EMITTING DIODE PACKAGE

TECHNICAL FIELD

The disclosure generally relates to a light emitting diode package and method for making the same.

DESCRIPTION OF RELATED ART

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

LEDs generate a great deal of heat during working. If the heat generated by the LEDs can not be dissipated to external environment efficiently, a temperature of the LEDs will increase. The increase of the temperature may affect lighting properties of the LEDs or even damage the LEDs.

Therefore, an improved LED package is desired to overcome the above described shortcoming.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of LED packages will now be described in detail below and with reference to the drawings.

Figure 1:
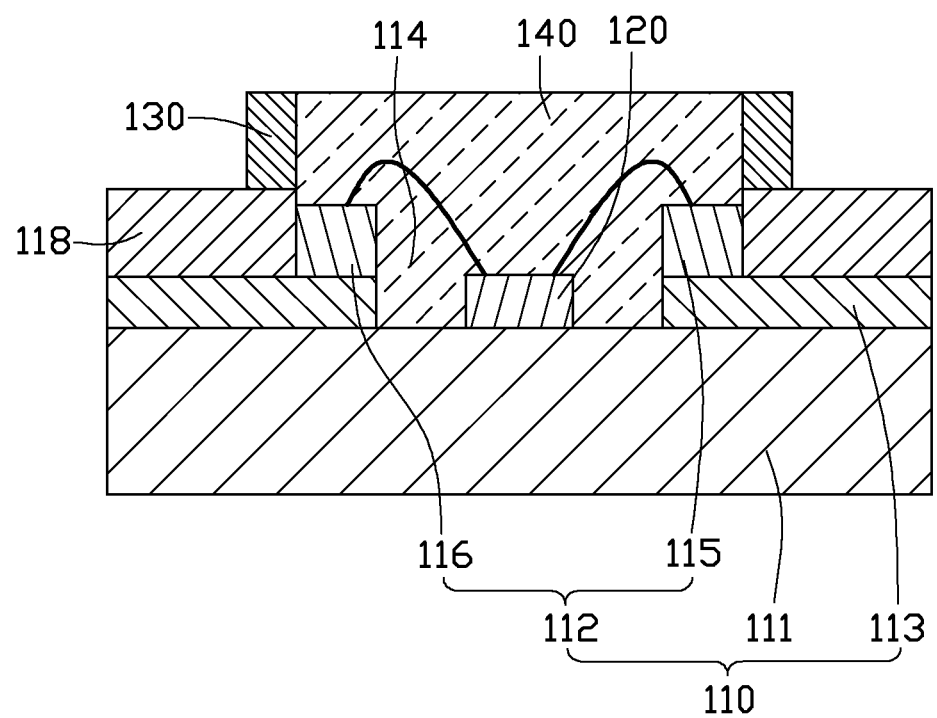
FIG. 1 shows a cross-sectional view of an LED package in accordance with a first embodiment of the present disclosure.

Referring to FIG. 1, an LED package in accordance with a first embodiment includes a substrate 110, an LED chip 120, a block wall 130 and an encapsulation 140.

The substrate 110 includes a first metal layer 111, a second metal layer 112 and an insulating layer 113 between the first metal layer 111 and the second metal layer 112. A cavity 114 is defined in central portions of the second metal layer 112 and insulating layer 113 to expose a central portion of the first metal layer 111. The second metal layer 112 surrounds the cavity 114 and is divided into a first conductive portion 115 and a second conductive portion 116. In this embodiment, the first metal layer 111 and the second metal layer 112 are both made of copper. The insulating layer 113 is made of epoxy laminated glass fiber cloth meeting NEMA (National Electrical Manufacturers Association) standard FR-5 or FR-4. A thickness of the first metal layer 111 is larger than a thickness of the second metal layer 112 to achieve a better heat dissipation of the LED chip 120. The thickness of the first metal layer 111 ranges from 0.2 mm to 0.3 mm. The thickness of the second metal layer 112 ranges from 0.015 mm to 0.02 mm. A thickness of the insulating layer 113 is about 0.1 mm.

The LED chip 120 is positioned inside the cavity 114 and on the exposed top surface of the first metal layer 111. Two electrodes of the LED chip 120 are electrically connected to the first conductive portion 115 and the second conductive portion 116 of the second metal layer 112. In this embodiment, the LED chip 120 is fixed on the upper surface of the first metal layer 111 by gluing, and the two electrodes of the LED chip 120 are electrically connected to the first conductive portion 115 and the second conductive portion 116 by wire bonding.

In this embodiment, an outer diameter of the second metal layer 112 is much less than that of the insulating layer 113, and an insulating coating 118 is formed on the insulating layer 13 and encircling the second metal layer 112. The insulating coating 118 covers an outer circumferential surface of second metal layer 112, thereby preventing the second metal layer 112 from being oxidized or having a short-circuit failure. In this embodiment, the insulating coating 118 is a little higher than the second metal layer 112. That is, a top of the insulating coating 118 is higher than a top of the second metal layer 112.

The block wall 130 is formed on the insulating coating 118, and is annular. An inner diameter of the block wall 13 is substantially equal to an outer diameter of the second metal layer 112. The block wall 130 is made of silica gel or plastic, and formed by molding or adhesive method. In this embodiment, the block wall 130 encircles a space above the first conductive portion 115 and the second conductive portion 116, thereby preventing the encapsulation 140 from flowing out of the LED package.

The encapsulation 140 is filled in the space surrounded by the block wall 130 and the cavity 114 and covers the LED chip 120. The encapsulation 140 is configured to prevent dust or moisture in the surrounding environment from entering the LED package to contaminate and affect the normal working of the LED chip 120. In this embodiment, because the space surrounded by the block wall 130 is directly above the cavity 114, the encapsulation 140 is also filled inside the block wall 130 and covers the first conductive portion 115 and the second conductive portion 116. The encapsulation 140 is made of epoxy resin or silica gel. In addition, phosphor particles can also be doped into the encapsulation 140 to obtain a desired color of light. The phosphor particles are made of a material selected from garnet, nitrides, phosphides, sulfides and silicates.

The LED package described above can be manufactured in following steps.

Figure 2:
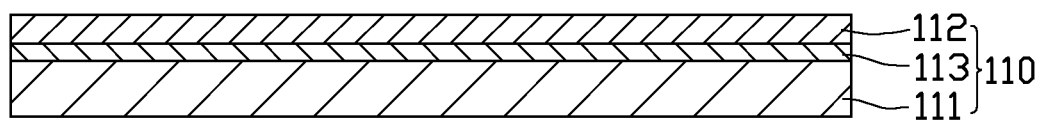
FIGS. 2-9 show steps for manufacturing the LED package in FIG. 1.

Referring to FIG. 2, a substrate 110 is provided. The substrate 110 includes a first metal layer 111, a second metal layer 112 and an insulating layer 113 sandwiched between the first metal layer 111 and the second metal layer 112. In this embodiment, the first metal layer 111 and the second metal layer 112 are made of copper. The insulating layer 113 is made of epoxy laminated glass fiber cloth meeting NEMA standard FR-5 or FR-4. A thickness of the first metal layer 111 is larger than a thickness of the second metal layer 112. In this embodiment, the thickness of the first metal layer 111 ranges from 0.2 mm to 0.3 mm. The thickness of the second metal layer 112 ranges from 0.015 mm to 0.02 mm. A thickness of the insulating layer 113 is about 0.1 mm.

Figure 3:
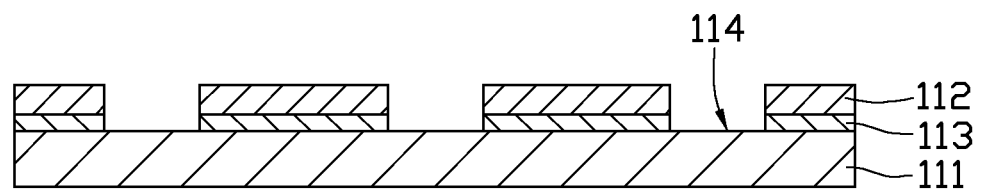

Referring to FIG. 3, a cavity 114 is defined in the second metal layer 112 and the insulating layer 113, thereby exposing an upper surface of the first metal layer 111.

Figure 4:
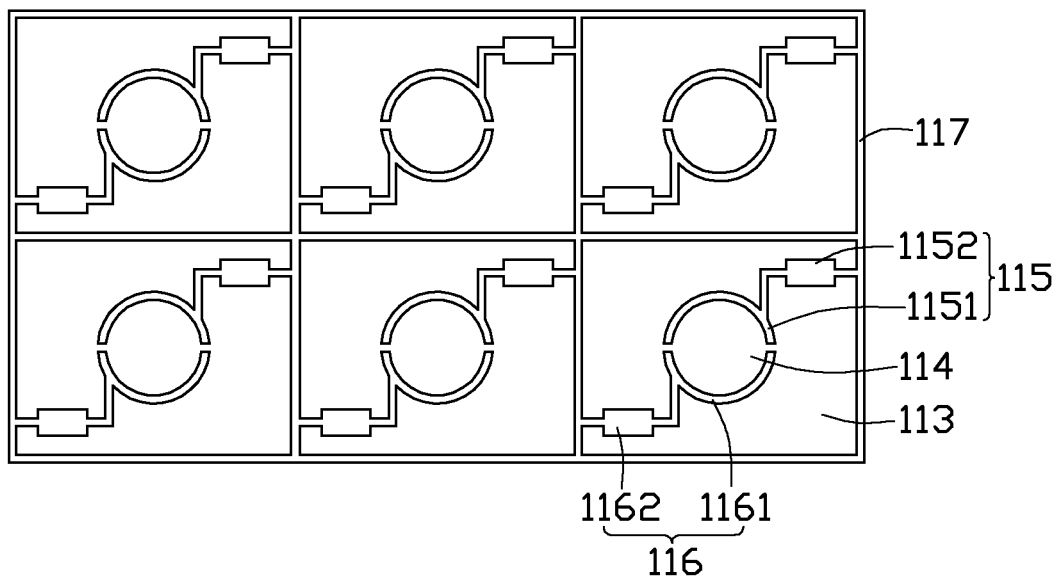

Referring to FIG. 4, the second metal layer 112 is partly etched to form spaced first conductive portion 115 and second conductive portion 116. In this embodiment, the first conductive portion 115 includes a first connecting section 1151 and a second connecting section 1152. The second conductive portion 116 includes a third connecting section 1161 and a fourth connecting section 1162. The first connecting section 1151 and the third connecting section 1161 each have a semicircular shape and together surround the cavity 114. The second connecting section 1152 and the fourth section 1162 are both rectangle-shaped and formed respectively at two opposite ends of the cavity 114. A metal wire square 117 is formed around each cavity 114 to electrically connect the first conductive portion 115 with the second conductive portion 116, before the substrate 110 is cut into pieces.

Figure 5:
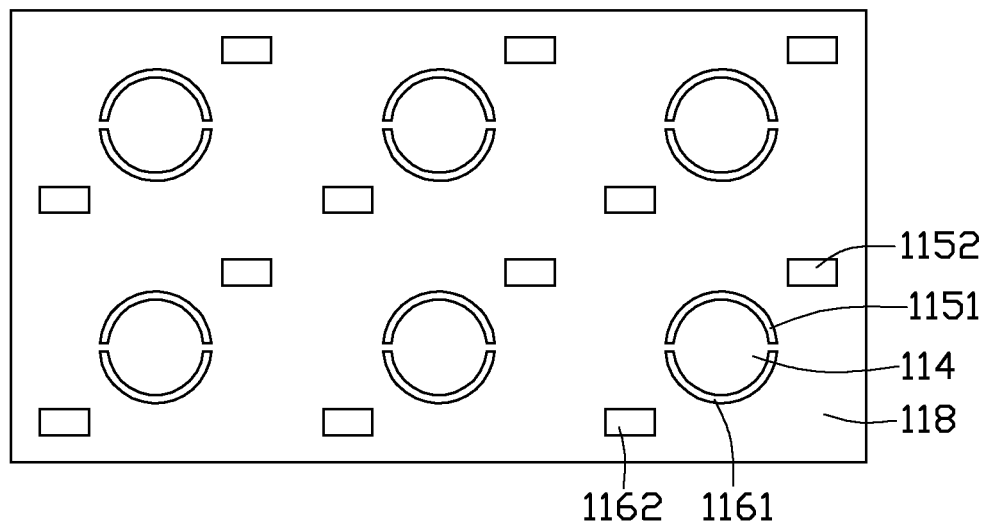

Referring to FIG. 5, a part of the second metal layer 112 is covered by an insulating coating 118. Therefore, only the first connecting section 1151, the second connecting section 1152, the third connecting section 1161 and the fourth connecting section 1162 are exposed to an external environment. The insulating coating 118 is configured to prevent the second metal layer 112 from being oxidized or having a short-circuit failure.

Figure 6:
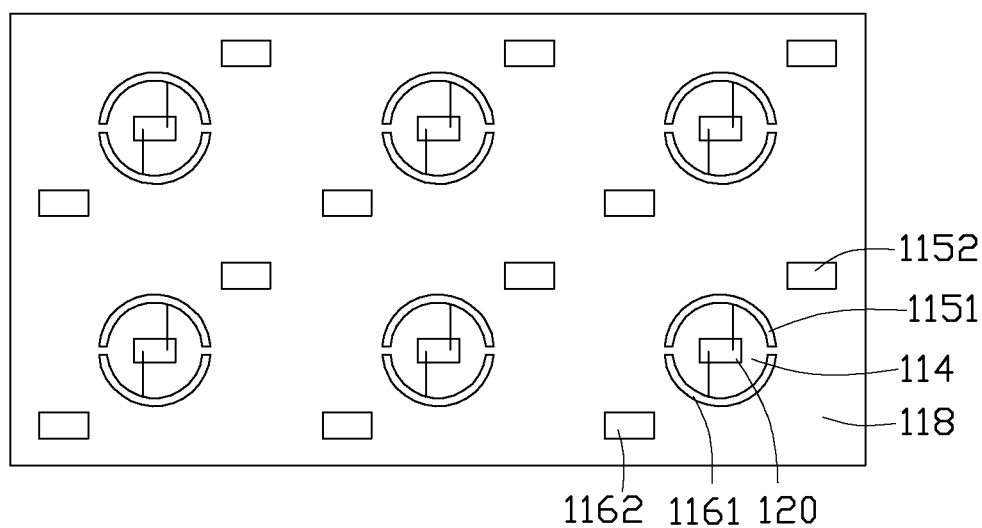

Referring to FIG. 6, an LED chip 120 is positioned inside the cavity 114 and fixed on the upper surface of the first metal layer 111 by gluing which uses a heat-conductive glue/adhesive. Two electrodes of the LED chip 120 are electrically connected to the first connecting section 1151 and the third connecting section 1161 respectively by wire bonding. The second connecting section 1152 and the fourth connecting section 1162 are for electrically connecting to an external power source. In alternative embodiments, before the LED chip 120 is positioned inside the cavity 114, an Al—Ni alloy is coated on an upper surface of the first metal layer 111 inside the cavity 114. The Al—Ni alloy is configured to prevent the upper surface of the first metal layer 111 inside the cavity 114 from being oxidized since it is exposed to the external environment before the packaging. Similarly, a bottom surface of the first metal layer 111 is also coated with the Al—Ni alloy to prevent the first metal layer 111 from being oxidized.

Figure 7:
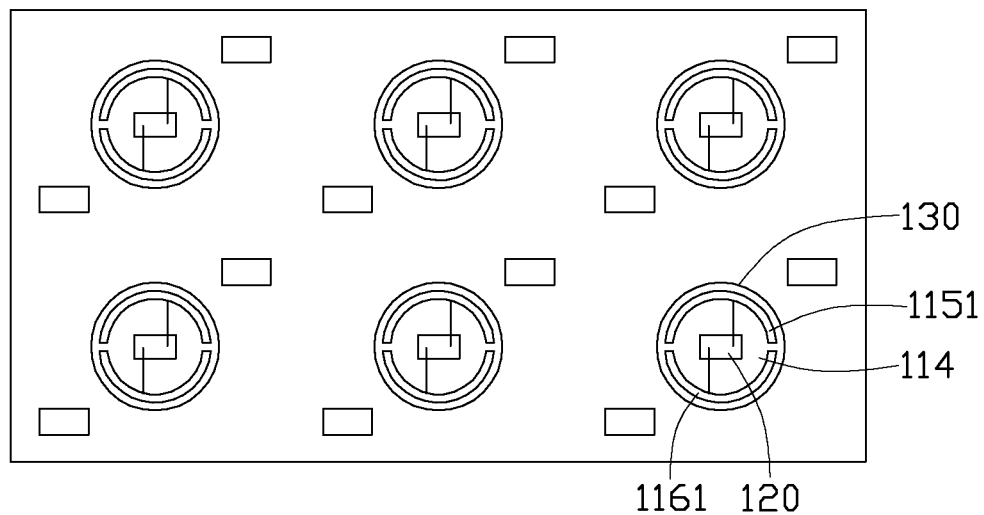

Referring to FIG. 7, an annular block wall 130 is formed around a space directly above the cavity 114. The block wall 130 is made of silica gel or plastic, and formed around the cavity by molding or adhering method. In this embodiment, the space surrounded by the block wall 130 is also above the first conductive portion 115 and the second conductive portion 116, thereby preventing the encapsulation 140 from flowing out of the LED package.

Figure 8:
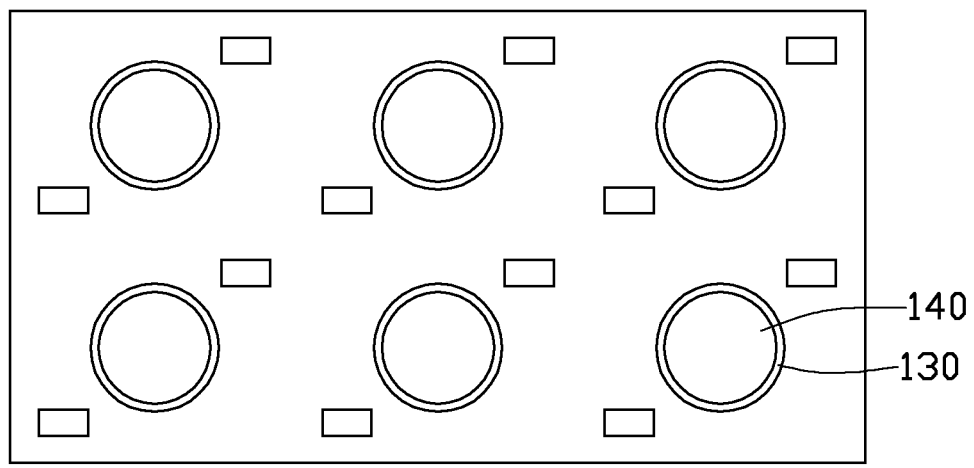

Referring to FIG. 8, the space surrounded by the block wall 130 is filled with an encapsulation 140. The encapsulation 140 is also filled in the cavity 114 and covers the LED chip 120. The encapsulation 140 is configured to prevent dust or moisture in the external environment from entering the LED package to contaminate the LED chip 120 and affect normal working of the LED chip 120. In this embodiment, because the block wall 130 is formed around the cavity 114, the encapsulation 140 is also filled inside the block wall 130 and covers the first conductive portion 115 and the second conductive portion 116. The encapsulation 140 is made of epoxy resin or silica gel. In addition, phosphor particles can also be doped into the encapsulation 140 to obtain a desired color of light. The phosphor particles are made of a material selected from garnet, nitrides, phosphides, sulfides and silicates.

Figure 9:
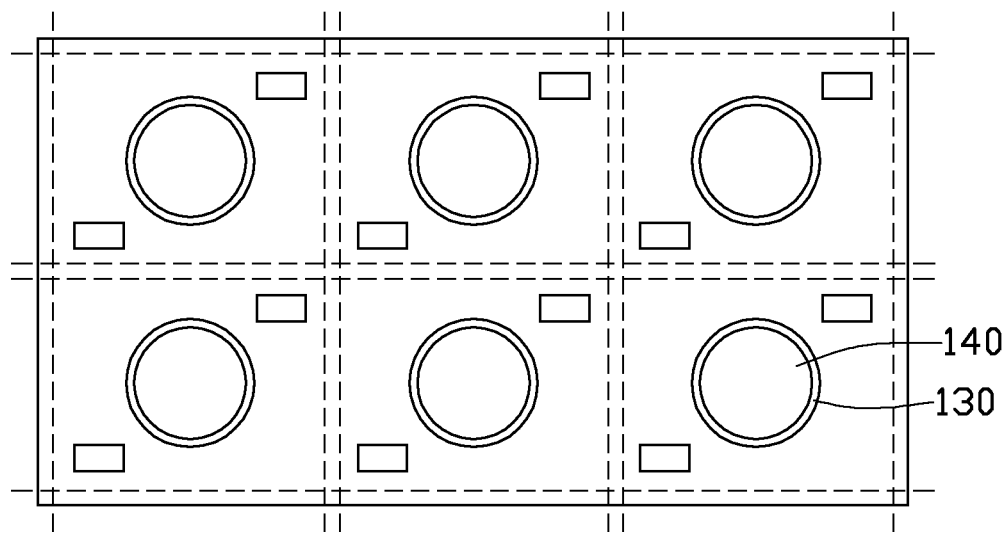

Referring to FIG. 9, the substrate 110 is cut into a plurality of LED packages. In the meantime, the first conductive portion 115 and the second conductive portion 116 are insulated from each other after the cutting of the substrate 110. The second connecting section 1152 and the fourth connecting section 1162 exposed to the external environment are configured for electrically connecting with an external power source. The cutting of the substrate 110 can be proceeded by mechanical cutting or laser cutting. In this embodiment, the substrate 110 is cut along edge line of the metal wire square 117. When the metal wire square 117 is removed, the first conductive portion 115 and the second conductive portion 116 are insulated from each other.

In the LED package described above, the LED chip 120 is directly formed on the upper surface of the first metal layer 111. Therefore, heat generated by the LED chip 120 can be directly transferred to the first metal layer 111 and dissipated to the outer environment. In addition, the second metal layer 112 is formed surrounding the cavity 114, heat generated by the LED chip 120 and transferred to the encapsulation 140 can be efficiently directed to the second metal layer 112 and dissipated to the outer environment, therefore preventing ageing of the encapsulation 140 because of heat.

In addition, in etching of the second metal layer 112, the first conductive portion 115 keeps in electrically connect with the second conductive portion 116. The electrical connection between the first conductive portion 115 and the second conductive portion 116 is kept until the cutting of the substrate 110. Therefore, when two electrodes of the LED chip 120 are electrically connected to the first conductive portion 115 and the second conductive portion 116 respectively, even there is static electricity existing in the substrate 110, the static electricity would not flow down to and damage the LED chip 120. Therefore, yield rate of the LED packages can be improved and cost can be reduced.

Figure 10:
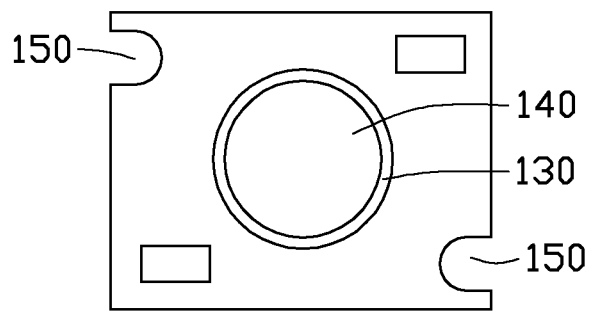
FIG. 10 shows a top plan view of an LED package in accordance with a second embodiment of the present disclosure.

In an alternative embodiment, a concave portion can be formed at lateral sides of the LED package to secure the LED package to a corresponding printed circuit board. Referring to FIG. 10, two concave portions 150 are formed respectively at two lateral sides of the LED package. In this embodiment, the concave portions 150 are semicircle-shaped and formed at diagonally opposite corners of the LED package. Screws can pass through the concave portions 150 and fix the LED package to a corresponding printed circuit board.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for making light emitting diode package, comprising:
   providing a substrate, the substrate comprising a first metal layer, a second metal layer and an insulating layer sandwiched between the first metal layer and the second metal layer;
   defining a plurality of cavities through the second metal layer and the insulating layer to expose the first metal layer;
   etching the second metal layer to form a plurality of pairs of spaced first conductive portion and second conductive portion each around a corresponding cavity;
   positioning LED chips inside the cavities to make the LED chips be in thermal connection with the first metal layer and electrically connecting two electrodes of each of the LED chips to a corresponding pair of first conductive portion and second conductive portion respectively; and
   filling the cavities with an encapsulation to cover the LED chips
   wherein after filling the cavities with the encapsulation, the substrate is cut into a plurality of individual light emitting diode packages each including a corresponding LED chip; and
   wherein the first conductive portion is electrically connected to the second conductive portion after the etching of the second metal layer and before the cutting of the substrate, and the first conductive portion is insulated from the second conductive portion after the cutting of the substrate.

2. The method of claim 1, wherein the insulating layer is made of epoxy laminated glass fiber cloth.

3. The method of claim 1, wherein a metal wire square is formed surrounding each of the cavities and electrically connecting the first conductive portion with the second conductive portion after the etching of the second metal layer and before the cutting of the substrate, and the metal wire square is removed to make the first conductive portion insulated from the second conductive portion during the cutting of the substrate.

* * * * *